(12) United States Patent
Donders et al.

(10) Patent No.: US 7,583,357 B2
(45) Date of Patent: Sep. 1, 2009

(54) LITHOGRAPHIC APPARATUS AND DEVICE MANUFACTURING METHOD

(75) Inventors: Sjoerd Nicolaas Lambertus Donders, Hertogenbosch (NL); Patrick Johannes Cornelus Hendrik Smulders, Best (NL); Peter Smits, Baarlo (NL)

(73) Assignee: ASML Netherlands B.V., Veldhoven (NL)

( * ) Notice: Subject to any disclaimer, the term of this patent is extended or adjusted under 35 U.S.C. 154(b) by 654 days.

(21) Appl. No.: 10/986,184

(22) Filed: Nov. 12, 2004

(65) Prior Publication Data

US 2006/0103820 A1    May 18, 2006

(51) Int. Cl.
G03B 27/42    (2006.01)
G03B 27/52    (2006.01)
G03B 27/58    (2006.01)

(52) U.S. Cl. ............................... 355/53; 355/30; 355/72
(58) Field of Classification Search .................... 355/30, 355/53, 72, 75; 310/10, 12
See application file for complete search history.

(56) References Cited

U.S. PATENT DOCUMENTS

| | | | | |
|---|---|---|---|---|
| 3,573,975 | A | | 4/1971 | Dhaka et al. ................ 117/212 |
| 3,648,587 | A | | 3/1972 | Stevens ........................ 95/44 |
| 4,346,164 | A | | 8/1982 | Tabarelli et al. ............. 430/311 |
| 4,390,273 | A | | 6/1983 | Loebach et al. ............. 355/125 |
| 4,396,705 | A | | 8/1983 | Akeyama et al. ............ 430/326 |
| 4,480,910 | A | | 11/1984 | Takanashi et al. ........... 355/30 |
| 4,509,852 | A | | 4/1985 | Tabarelli et al. ............. 355/30 |
| 4,861,162 | A | * | 8/1989 | Ina .............................. 356/401 |
| 5,040,020 | A | | 8/1991 | Rauschenbach et al. ....... 355/53 |
| 5,537,186 | A | * | 7/1996 | Korenaga et al. ............. 355/53 |
| 5,553,994 | A | * | 9/1996 | Biche et al. ............... 198/750.2 |
| 5,610,683 | A | | 3/1997 | Takahashi .................... 355/53 |
| 5,715,039 | A | | 2/1998 | Fukuda et al. ................ 355/53 |
| 5,825,043 | A | | 10/1998 | Suwa .......................... 250/548 |
| 5,900,354 | A | | 5/1999 | Batchelder .................. 430/395 |
| 5,923,408 | A | * | 7/1999 | Takabayashi ................ 355/53 |
| 6,191,429 | B1 | | 2/2001 | Suwa .......................... 250/548 |
| 6,236,634 | B1 | | 5/2001 | Lee et al. .................... 369/112 |
| 6,305,677 | B1 | * | 10/2001 | Lenz ............................ 269/13 |
| 6,400,445 | B2 | * | 6/2002 | Nishi et al. .................... 355/72 |
| 6,496,350 | B2 | * | 12/2002 | Fujiwara .................... 361/234 |
| 6,560,032 | B2 | | 5/2003 | Hatano ....................... 359/656 |
| 6,593,995 | B1 | * | 7/2003 | Hogestyn .................... 355/41 |

(Continued)

FOREIGN PATENT DOCUMENTS

DE    206 607    2/1984

(Continued)

OTHER PUBLICATIONS

M. Switkes et al., "Immersion Lithography at 157 nm", MIT Lincoln Lab, Orlando 2001-1, Dec. 17, 2001.

(Continued)

*Primary Examiner*—Alan A Mathews
(74) *Attorney, Agent, or Firm*—Pillsbury Winthrop Shaw Pittman LLP (57) ABSTRACT

In an immersion lithographic apparatus, a closing plate is used to contain liquid in a liquid confinement structure while, for example, substrates are swapped on a substrate table. A closing plate displacement mechanism using, for example, a combination of one or more leaf springs and one or more electromagnets or a combination of one or more linear actuators and one more pins, is used to moving the closing plate toward or from the liquid confinement structure. In an embodiment, an adjustment plate is used to compensate for closing plates of varying thickness in closing plate receptacles of varying depth on different substrate tables.

32 Claims, 7 Drawing Sheets

U.S. PATENT DOCUMENTS

| | | | |
|---|---|---|---|
| 6,600,547 | B2 | 7/2003 | Watson et al. |
| 6,603,130 | B1 | 8/2003 | Bisschops et al. ......... 250/492.1 |
| 6,633,365 | B2 | 10/2003 | Suenaga ....................... 355/53 |
| 7,057,702 | B2 * | 6/2006 | Lof et al. ....................... 355/30 |
| 7,110,081 | B2 * | 9/2006 | Hoogendam et al. .......... 355/30 |
| 2002/0020821 | A1 | 2/2002 | Van Santen et al. .......... 250/492 |
| 2002/0163629 | A1 | 11/2002 | Switkes et al. ................ 355/53 |
| 2003/0123040 | A1 | 7/2003 | Almogy ........................ 355/69 |
| 2003/0174408 | A1 | 9/2003 | Rostalski et al. ............. 359/642 |
| 2004/0000627 | A1 | 1/2004 | Schuster |
| 2004/0021844 | A1 | 2/2004 | Suenaga |
| 2004/0046952 | A1 * | 3/2004 | Korenaga ..................... 355/72 |
| 2004/0075895 | A1 | 4/2004 | Lin .............................. 359/380 |
| 2004/0109237 | A1 | 6/2004 | Epple et al. |
| 2004/0114117 | A1 | 6/2004 | Bleeker |
| 2004/0119954 | A1 | 6/2004 | Kawashima et al. .......... 355/30 |
| 2004/0125351 | A1 | 7/2004 | Krautschik ................... 355/53 |
| 2004/0135099 | A1 | 7/2004 | Simon et al. |
| 2004/0136494 | A1 | 7/2004 | Lof et al. |
| 2004/0160582 | A1 | 8/2004 | De Smit et al. |
| 2004/0165159 | A1 | 8/2004 | Lof et al. |
| 2004/0207824 | A1 | 10/2004 | Lof et al. |
| 2004/0211920 | A1 | 10/2004 | Derksen et al. |
| 2004/0263809 | A1 | 12/2004 | Nakano ........................ 355/30 |
| 2006/0033894 | A1 * | 2/2006 | Binnard ........................ 355/30 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-000521 A | 1/1998 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-289128 A | 10/2004 |
| JP | 2006-024706 A | 1/2006 |
| JP | 2006-100686 A | 4/2006 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 A2 | 10/2004 |
| WO | WO 2004/090577 A3 | 10/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths To Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future Fab International, vol. 15, Jul. 11, 2003.

H. Kawata et al., "Fabrication of 0.2 μm Fine Patterns Using Optical Projection Lithography with an Oil Immersion Lens", Jpn. J. Appl. Phys. vol. 31 (1992), pp. 4174-4177.

G. Owen et al., "1/8 μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial $\lambda$/NA scaling equations for resolution, depth of focus, and immersion lithography, *J. Microlith., Microfab., Microsyst.* 1(1):7-12 (2002).

U.S. Appl. No. 10/698,012, filed Oct. 31, 2003, Flagello et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/719,683, filed Nov. 24, 2003, Streefkerk et al.
U.S. Appl. No. 10/367,910, filed Feb. 19, 2003, Suwa et al.
U.S. Appl. No. 10/966,111, filed Oct. 18, 2004, Van der Toorn et al.
English translation of Japanese Official Action issued on Jan. 20, 2009 in Japanese Application No. 2005-327405.

* cited by examiner

LITHOGRAPHIC APPARATUS AND DEVICE MANUFACTURING METHOD

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
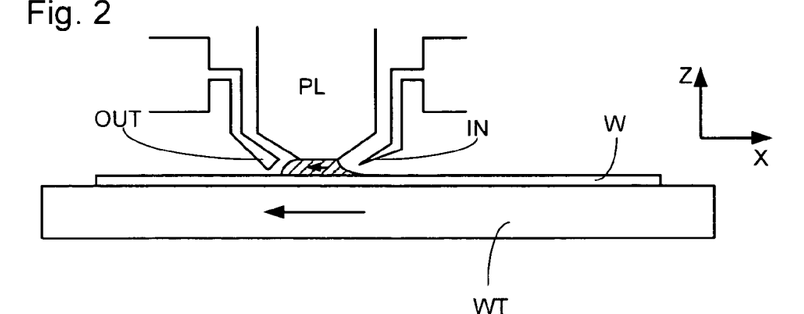
FIGS. 2 and 3 depict a liquid supply system for use in a lithographic projection apparatus.
Figure 3:
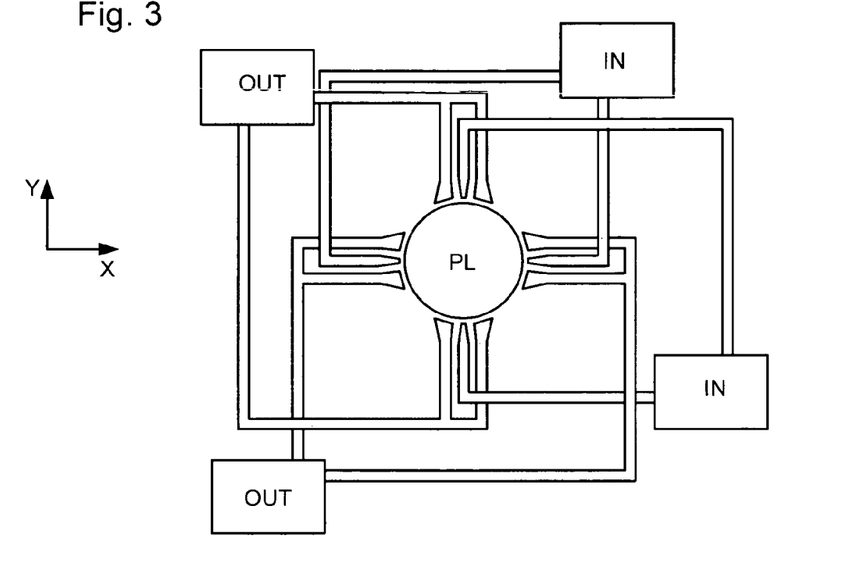

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Once a substrate has been exposed, it is necessary to remove it and swap it with the next substrate to be exposed. In an immersion lithography apparatus, it is typically undesirable to empty the system of the immersion liquid in order to remove the substrate and then refill it when the next substrate is in place. This is because drying of and rewetting the projection system (typically the last optical element thereof closest to the substrate) may take a long time and so possibly reduce throughput of substrates through the apparatus. Additionally or alternatively, emptying and refilling may increase the probability of dry spots or gas bubbles forming on the projection system and disturbing the projection beam as it passes through the projection system into the liquid.

SUMMARY

Accordingly, it would be advantageous, for example, to keep the projection system wet during, for instance, substrate swap (i.e., removal of a substrate and replacement with a new substrate).

According to an embodiment of the invention, in order to keep the last optical element of the projection system wet, a closing plate is used to during the execution of the substrate swap. During the exposure of a substrate, the closing plate is kept on the substrate table in its own receptacle. The closing plate has a depth about equal to the depth of the receptacle in the substrate table. The closing plate works by replacing the substrate below a liquid confinement structure. To do this, the liquid confinement structure is transferred from being positioned adjacent to the substrate to being adjacent the closing plate. In an implementation, the liquid confinement structure then moves downward to meet the closing plate and/or the substrate table, including the closing plate in its receptacle, moves up to meet the liquid confinement structure. The closing plate then may be attached to the liquid confinement structure by, for example, vacuum or magnetic force. The closing plate may be removed from the liquid confinement structure by reversing the above steps.

Loading and unloading the closing plate in this manner may result in a large force applied between the liquid confinement structure and the closing plate because of the respective velocity of the liquid confinement structure and/or the closing plate and the large mass of the substrate table. A collision with this sort of force may disturb the frame holding the liquid confinement structure (and so may disturb the accuracy of one or more measurement devices attached to or using the frame) and may cause mechanical damage. Furthermore, throughput of substrates through the apparatus may be influenced by a slow velocity of the substrate table and/or the liquid confinement structure which may need to be employed in order to reduce the force of an impact between the liquid confinement structure and the substrate table holding the closing plate.

Further, use of a closing plate loading and unloading system may mean that the closing plate receptacles on different substrate tables must be able to accommodate more than one size of closing plate. A closing plate that has a depth that matches the depth of one receptacle may not be exactly the right depth for another receptacle. If a closing plate does not fit in the receptacle properly so that its upper surface is substantially level with the upper surface of the substrate table, the risk of a damaging collision may be increased.

Accordingly, it would be advantageous, for example, to have a closing plate mechanism which reduces the risk of a damaging collision between the liquid confinement structure of a projection apparatus and a closing plate on a substrate table.

According to an aspect of the invention, there is provided a lithographic apparatus, comprising:

a substrate table constructed to hold a substrate;

a projection system configured to project a patterned radiation beam onto a target portion of the substrate;

a receptacle in the substrate table configured to have a closing plate; and a displacement mechanism provided in the substrate table arranged to move a closing plate from or toward the receptacle.

According to another aspect of the invention, there is provided a lithographic apparatus, comprising:

a substrate table constructed to hold a substrate;

a projection system configured to project a patterned radiation beam onto a target portion of the substrate;

a receptacle in the substrate table configured to contain a closing plate and having a depth; and an adjustment plate arranged to vary the depth of the receptacle.

According to another aspect of the invention, there is provided a device manufacturing method, comprising:

projecting a patterned beam of radiation through a liquid, which is contained by a liquid confinement structure, onto a substrate held by a substrate table; and after projecting the patterned beam, moving the substrate table to a position such that a closing plate on the substrate table is positioned under the liquid confinement structure, and while the substrate table is held stationary relative to the liquid confinement structure, moving the closing plate to close a portion of the liquid confinement structure.

According to an aspect of the invention, there is provided a substrate table for a lithographic apparatus, the substrate table comprising:

a support surface configured to hold a substrate;

a receptacle configured to contain a closing plate; and a displacement mechanism provided in the substrate table arranged to move a closing plate from or toward the receptacle.

According to an aspect of the invention, there is provided a lithographic apparatus, comprising:

a substrate table constructed to hold a substrate;

a projection system configured to project a patterned radiation beam onto a target portion of the substrate;

a liquid supply system configured to at least partly fill a space between the projection system and the substrate with a liquid, the liquid supply system comprising a liquid confinement structure configured to at least partly confine the liquid within the space;

a closing plate configured to close off the liquid confinement structure so as to retain a fluid in the liquid confinement structure when the substrate or the substrate table is no longer adjacent the liquid confinement structure; and a displacement mechanism provided in the substrate table arranged to move the closing plate from or toward the liquid confinement structure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 6b depicts a side view of the first substrate table WT1 of FIG. 6a;

FIG. 7b depicts a side view of the second substrate table WT2 of FIG. 7a;

DETAILED DESCRIPTION

Figure 1:
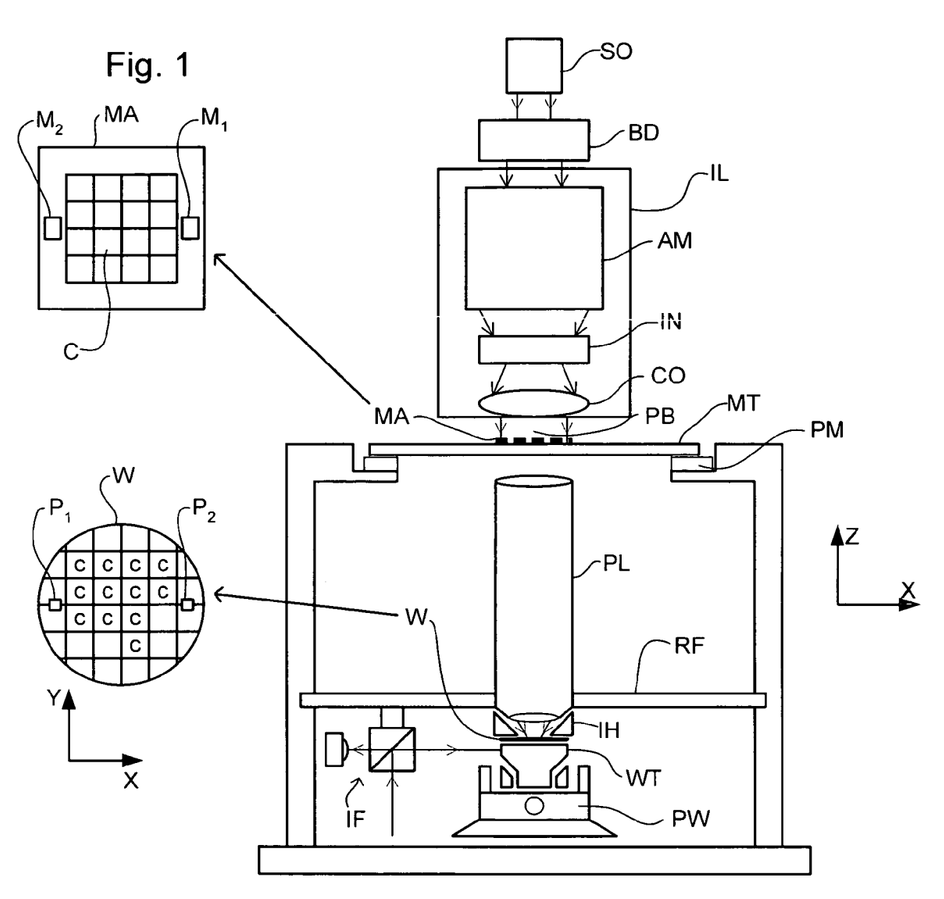
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam PB (e.g. UV radiation or DUV radiation).

a support structure (e.g. a mask table) MT constructed to hold a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask MA), which is held on the support structure (e.g., mask table MT), and is patterned by the patterning device. Having traversed the mask MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
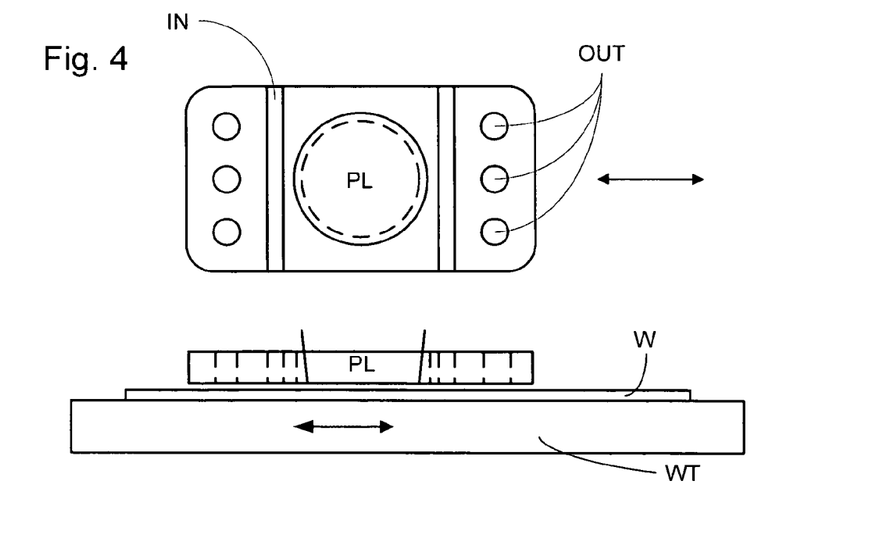
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
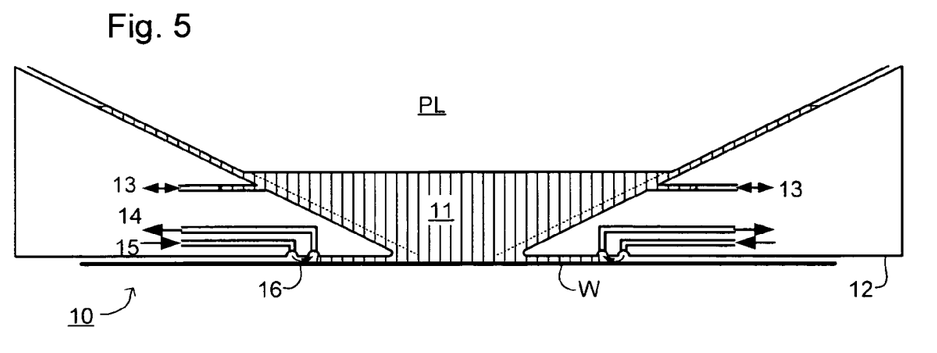
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a system is shown in FIG. 5. The liquid confinement structure is substantially stationary relative to the projection system in the XY plane though there may be some relative movement in the Z direction (in the direction of the optical axis). A seal is formed between the liquid confinement structure and the surface of the substrate. In an embodiment, the seal is a contactless seal such as a gas seal. Such a system with a gas seal is disclosed in U.S. patent application Ser. No. 10/705,783, hereby incorporated in its entirety by reference.

FIG. 5 depicts an arrangement of a reservoir 10, which forms a contactless seal to the substrate around the image field of the projection system so that liquid 11 is confined to fill a space between the substrate surface and the final element of the projection system. A liquid confinement structure 12 positioned below and surrounding the final element of the projection system PL forms the reservoir. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end preferably closely conforms to the shape of the projection system or the final element thereof and may, e.g., be round. At the bottom, the inner periphery closely conforms to the shape of the image field, e.g., rectangular though this need not be the case.

The liquid may be confined in the reservoir by, for example, a gas seal 16 between the bottom of the liquid confinement structure 12 and the surface of the substrate W. The gas seal is formed by gas, e.g. air, synthetic air, $N_2$ or an inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid. It will be understood by the person skilled in the art that other types of seal could be used to contain the liquid.

When the substrate W is removed, the gas seal may form between the liquid confinement structure and the substrate table. In an embodiment, the gas seal is relied upon as little as possible since the more it is used, the greater the risk of dry spots on the final element of the projection system or gas bubbles in the liquid. As little exposure as possible to external gases is desired to prevent dry spots on the projection system. Alternative methods of confining the liquid may be used such as a mechanical method.

Figure 6A:
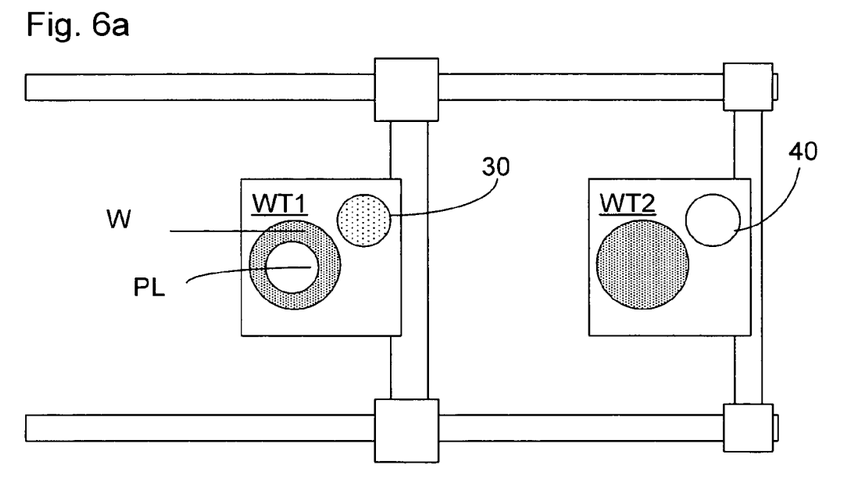
FIG. 6a depicts a plan view of two substrate tables, one of which is under the projection system of a lithographic projection apparatus.
Figure 6B:
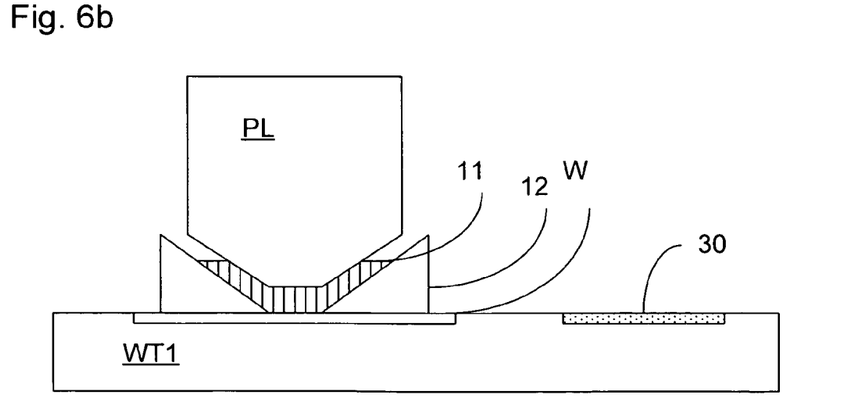

FIGS. 6a and 6b show a first substrate table WT1 in a position at which substrate W may be exposed. The projection system PL is positioned above the substrate W on the first substrate table WT1. This first substrate table WT1 also contains a closing plate 30 in a receptacle 40 on the substrate table. The second substrate table WT2 has an empty closing plate receptacle 40.

Figure 7A:
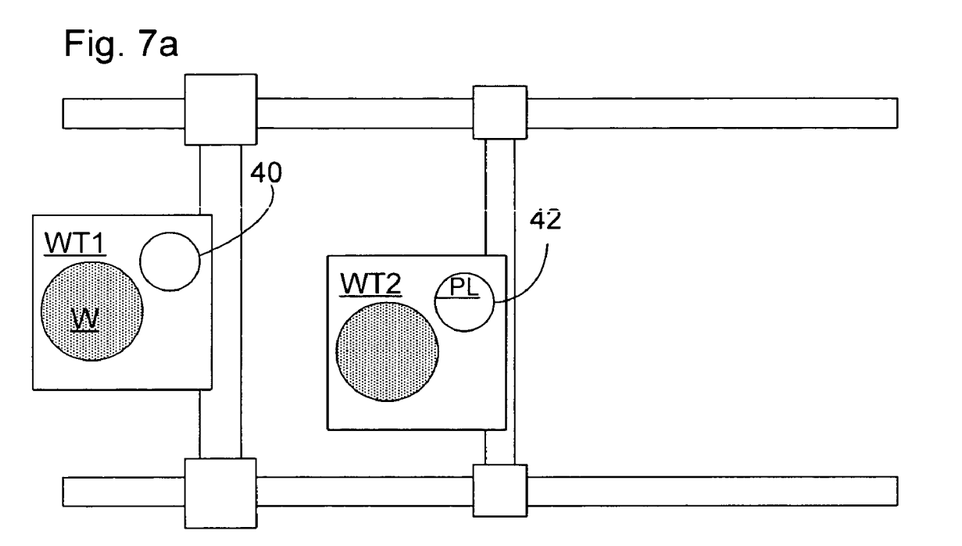
FIG. 7a depicts a plan view of the two substrate tables shown in FIG. 6a with the projection system above the closing plate of the second substrate table WT2.
Figure 7B:
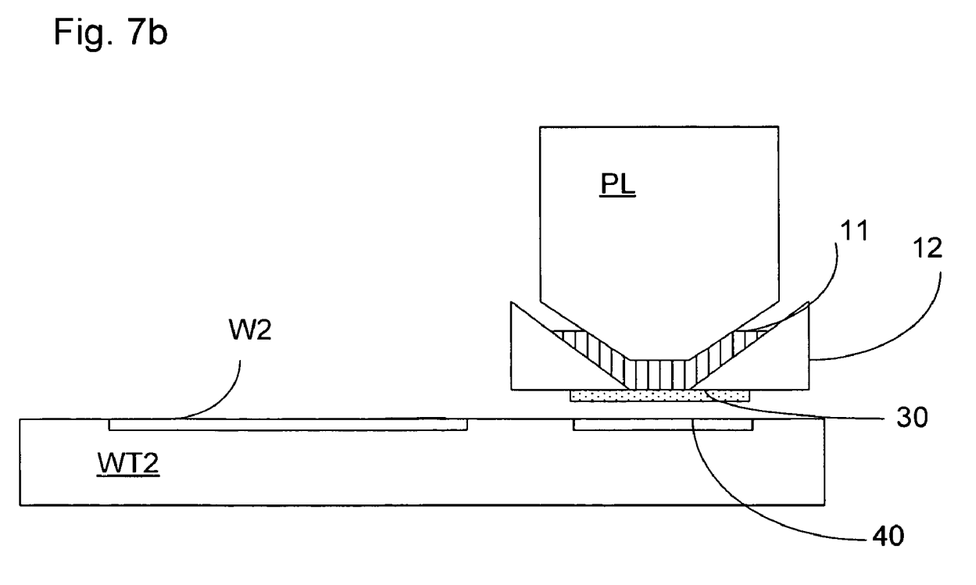

FIGS. 7a and 7b show the substrate tables WT1, WT2 during a substrate swap process. The closing plate 30 has replaced the substrate W in its position below the liquid confinement structure 12 adjacent the projection system PL. Where the substrate was positioned below the projection system PL, the closing plate is now coupled with the liquid confinement structure 12. The second substrate table WT2 is moved to be positioned adjacent to the projection system PL and to the liquid confinement structure 12 coupled with the closing plate 30. Once the second substrate table WT2 is properly positioned, the closing plate 30 may be put into the receptacle 40 on the second substrate table WT2 by movement of the liquid confinement structure 12 and/or the second substrate table WT2. Once the closing plate 30 is put into receptacle 40 on the second substrate table WT2, the second substrate table WT2 may be moved under the projection system PL in order expose the substrate W2. Between the closing plate being coupled with the liquid confinement structure 12 and the substrate W being positioned below the liquid confinement structure 12, the gas seal or some other liquid containment mechanism confines the liquid for a short time. In FIG. 7a, the projection system and liquid confinement structure coupled with the closing plate 30 above receptacle 40 of substrate table WT2 is given as reference numeral 42.

Figure 8:
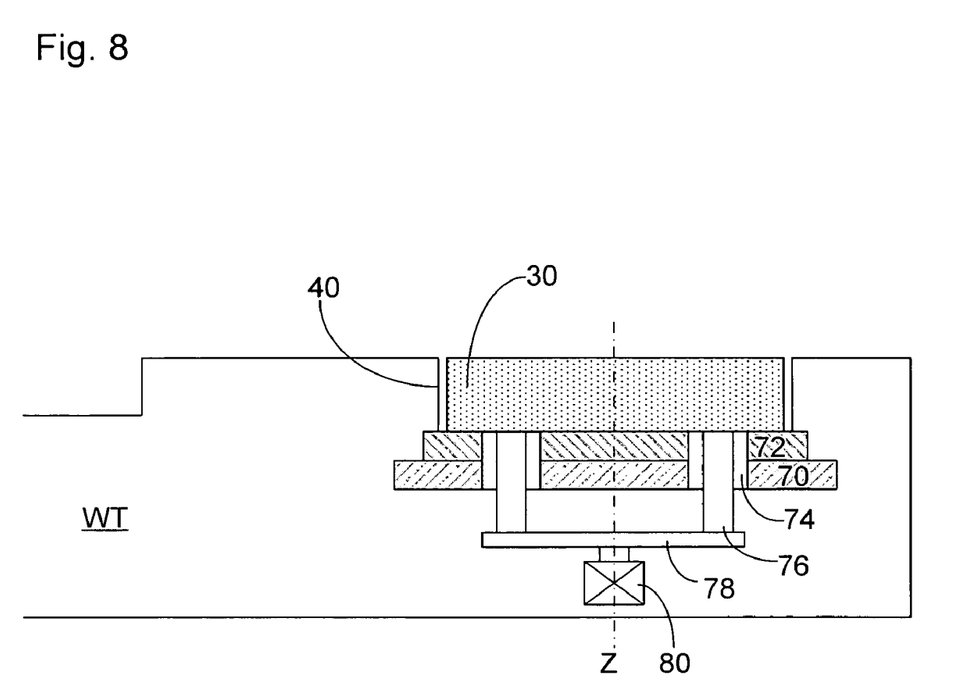
FIG. 8 depicts a closing plate with a displacement mechanism according to a first embodiment of the present invention.
Figure 9:
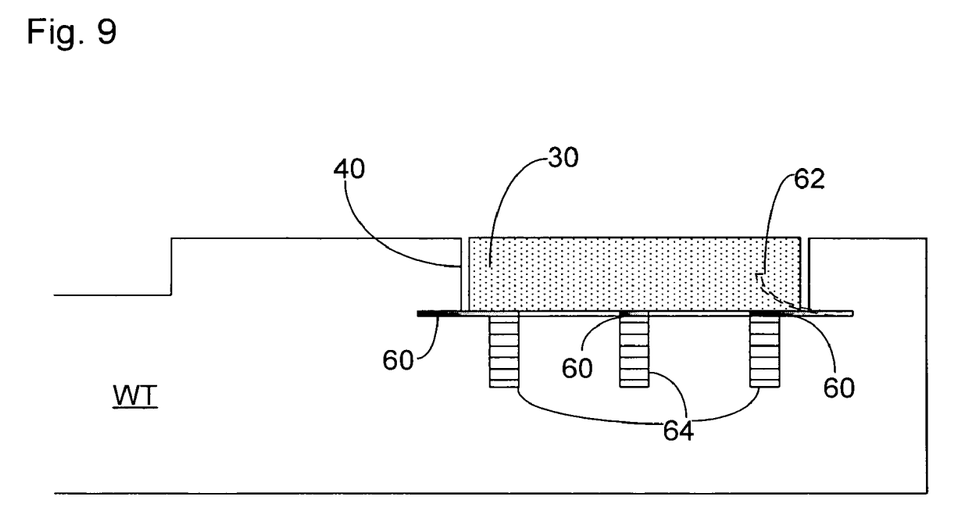
FIG. 9 depicts a closing plate with a displacement mechanism according to a second embodiment of the present invention.

Rather than moving a substrate table WT, WT2 and/or the liquid confinement structure 12 in order to couple the closing plate 30 with the liquid confinement structure 12 or to decouple the closing plate 30 from the liquid confinement structure 12, a displacement mechanism, examples of which are shown in FIGS. 8 and 9, may be used to move the closing plate 30 towards and/or away from the liquid confinement structure 12 separately from the substrate table. In an embodiment, the closing plate may be made of metal or glass.

The mass of a closing plate may be about 10 grams, much less than the mass of a substrate table which may be of the order of tens of kilograms. Thus, for example, the force between a rising closing plate and a liquid confinement structure 12 (which optionally may be descending toward the closing plate) will be much lower than if a heavier substrate table were raised to meet the liquid confinement structure. If the mass of the moving component is reduced, its force is reduced and so the result of a collision between the closing plate and the liquid confinement structure will be much less damaging than a collision between a heavier substrate table and the liquid confinement structure.

Furthermore, a displacement mechanism for an object with a lower mass is typically easier to manufacture and run than a displacement mechanism for an object with a greater mass. In other words, for example, it is usually easier to make a weak actuator with a low mass than a weak actuator with a large mass; and the actuation strength is what determines the acceleration of the object (e.g., the closing plate or the substrate table). The actuation of the closing plate (rather than, for example, the substrate table) may thus reduce the chance of a damaging collision with the liquid confinement structure. Additionally or alternatively, actuation of the closing plate may mean that a weaker displacement mechanism, that may be cheaper and easier to manufacture, may be used rather than a stronger displacement mechanism for moving, for example, the entire substrate table.

Furthermore, the closing plate may be coupled with the liquid confinement structure 12 more quickly because the risk of a damaging collision may be lower (i.e. the force of the closing plate may still be reduced if its mass is reduced more than its acceleration is increased). Thus, the speed of a substrate swap may be increased and throughput time reduced.

In an embodiment, a closing plate holder may be lifted as well as the closing plate. The closing plate holder may be, for example, a 1.5 mm thick vacuum table for a pin type displacement mechanism as discussed with reference to FIG. 8 below. An advantage of a closing plate holder is that the closing plate may be protected from damage, which might be caused by a displacement mechanism acting directly on the closing plate.

FIG. 8 illustrates a pin type of displacement mechanism. The substrate table WT comprises a vacuum table part 70 made of a material having substantially zero thermal coefficient of expansion such as Zerodur, atop of which is a so-called pimple- or burl-plate 72. Defined vertically through the table part 70 and the plate 72 are a plurality of through-holes 74 (in an embodiment shown in FIG. 8, three holes are provided of which two are shown in FIG. 8) which allow one or more pins, described below, and that are part of the displacement mechanism, to come into engagement with a lower surface of the closing plate during movement of the closing plate.

The upper major surface of the plate 72 has a recessed surface which defines, together with the lower major face of the closing plate, a laminar underpressure chamber. When the closing plate 30 is to be held against the plate 72, this chamber is evacuated by means of a pump (not shown) and passageways (also not shown) through the table part 70 and plate 72.

In an embodiment, the holes 74 are arranged symmetrically, at the vertices of an equilateral triangle centered on a vertical axis Z of the substrate table WT and of the closing plate 30. The axis Z coincides with the center of gravity of the closing plate 30. Coaxially within the holes 74, and consequently similarly symmetrically arranged, are three pins 76 which are of equal length and held by a rigid carrier plate 78 below and substantially parallel to the plate 72 and table part 70. The upper extremities of the pins coincide in a horizontal plane, which is substantially parallel to the lower face of the closing plate 30.

Once the pressure in the underpressure chamber has been increased, the pins may be driven upwardly, e.g. by moving the carrier plate 78 upwardly from the FIG. 8 position, to lift the closing plate from the plate 72. Similarly, the pins may be driven upwardly to meet a closing plate 30 coupled, for example, to the liquid confinement structure in order to put the closing plate 30 in the receptacle 40. A linear actuator 80 of the pin group 76 may be used to cause the pins to project through their respective holes and contact against the underside of the closing plate, to lift the closing plate 30 clear of the plate 72 or to place the closing plate 30 onto the plate 72. The actuator 80 may be a linear electric motor e.g. of the well-known voice-coil type. Instead of a carrier plate 78, each of the pins may be individually movable by an actuator.

In an embodiment, one pin may be used. Further, in an embodiment, the holes 74 may not extend through the plate 72 and instead act against the plate 72 so that movement of the plate 72 causes movement of the closing plate 30 lying on top of the plate 72. As discussed above, this type of closing plate holder may avoid direct operation of the displacement mechanism against the closing plate 30.

FIG. 9 illustrates a displacement mechanism comprising one or more pre-stressed leaf springs actuated by one or more electromagnets. A separate magnet may be provided for each of a plurality of leaf springs or a single magnet may be provided for all of a plurality of leaf springs, or any other combination may be provided. In an embodiment, the one or more leaf springs are made of steel.

FIG. 9 shows substrate table WT with a closing plate receptacle 40 containing a closing plate 30. Three stressed leaf springs 60 are held in their stressed state by electromagnets 64. When the electromagnets are switched off, the stressed leaf springs 60 return to their unstressed shape which is depicted by reference numeral 62, thereby lifting the closing plate 30. The velocity with which the closing plate 30 is lifted is determined by the unstressing returned force of the leaf springs, and the number of leaf springs used. To return a closing plate 30 to the receptacle 40, the unstressed leaf spring(s) 60 may be positioned in contact with a closing plate 30, for example, coupled to the liquid confinement structure and then the electromagnet(s) may be engaged to stress the leaf spring(s) 60 to put the closing plate 30 into the receptacle.

While in the embodiments described above a recessed receptacle 40 has been described, it may not be necessary to provide a receptacle 40 that is recessed. For example, the closing pate 30 may simply just lie on top of the substrate table WT in a designated receptacle 40 where the displacement mechanism is provided. In such a case, a gap between the liquid confinement structure 12 and the substrate W and/or substrate table WT should remain sufficiently large to avoid collision of the liquid confinement structure 12 with the closing plate 30.

Figure 10:
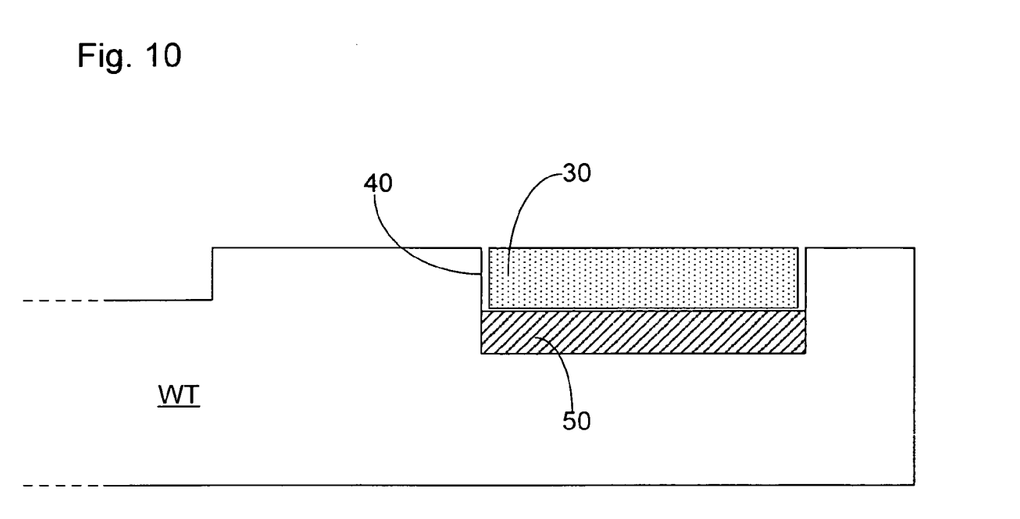
FIG. 10 depicts a closing plate and an adjustment plate in a closing plate receptacle.

FIG. 10 shows a section of a substrate table WT with a closing plate receptacle 40 containing a closing plate 30. The closing plate 30 is not the same depth as the recessed receptacle 40 because, for instance, it has the correct size for a closing plate receptacle 40 on a different substrate table. In order to compensate for this difference in closing plate depth, an adjustment plate 50 may be used to raise the top surface of the closing plate 30 so that it is at substantially the same height as the top surface of the substrate table WT. In this way, it is possible to use a single closing plate 30 for two or more substrate tables. This is because an adjustment plate 50 enables a closing plate 30 always to fit in a closing plate receptacle 40 of any substrate table. The combination of the adjustment plate 50 and the closing plate 30 may be moved together using the displacement mechanisms described herein.

Under normal conditions, the depth of a recessed closing plate receptacle 40 is about of 50 to 200 microns. The liquid confinement structure and closing plate must meet with certain tolerances in order not to undergo a damaging collision. In particular, the required tolerance for a closing plate's height (depth) relative to the surface of the substrate table in which it is contained should be about 5 microns. An adjustment plate compensates for this range in recessed closing plate receptacle depth by making up for the difference in the recessed receptacle depth and the depth of the closing plate.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the present invention may be applied to any immersion lithography apparatus, in particular, but not exclusively, to those types mentioned above. A liquid supply system is any mechanism that provides a liquid to a space between the projection system and the substrate and/or substrate table. It may comprise any combination of one or more structures, one or more liquid inlets, one or more gas inlets, one or more gas outlets, and/or one or more liquid outlets, the combination providing and confining the liquid to the space. In an embodiment, a surface of the space may be limited to a portion of the substrate and/or substrate table, a surface of the space may completely cover a surface of the substrate and/or substrate table, or the space may envelop the substrate and/or substrate table.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus, comprising:
a substrate table constructed to hold a substrate;
a projection system configured to project a patterned radiation beam onto a target portion of the substrate;
a receptacle in the substrate table configured to have a closing plate; and
a displacement mechanism provided in the substrate table arranged to move the closing plate from the receptacle.

2. The apparatus according to claim 1, wherein the displacement mechanism comprises a linear actuator provided in or at the receptacle.

3. The apparatus according to claim 2, wherein the displacement mechanism comprises a pin mechanism.

4. The apparatus according to claim 3, wherein the pin mechanism comprises 3 pins.

5. The apparatus according to claim 1, further comprising a movable closing plate holder disposed between the displacement mechanism and, in use, a closing plate.

6. The apparatus according to claim 1, wherein the displacement mechanism comprises a leaf spring actuated by a magnet.

7. The apparatus according to claim 6, wherein the leaf spring is made of steel.

8. The apparatus according to claim 6, comprising two leaf springs actuated by an electromagnet.

9. The apparatus according to claim 6, comprising three leaf springs each actuated by an electromagnet.

10. The apparatus according to claim 1, wherein the receptacle contains an adjustment plate configured to raise a closing plate.

11. The apparatus according to claim 1, wherein the closing plate comprises glass or metal.

12. The apparatus according to claim 1, wherein the displacement mechanism is arranged to move the closing plate toward the receptacle.

13. A device manufacturing method, comprising:
projecting a patterned beam of radiation through a liquid, which is contained by a liquid confinement structure, onto a substrate held by a substrate table; and
after projecting the patterned beam, moving the substrate table to a position such that a closing plate on the substrate table is positioned under the liquid confinement structure, and
while the substrate table is held stationary relative to the liquid confinement structure, moving the closing plate, using a displacement mechanism provided in the substrate table, to close a portion of the liquid confinement structure.

14. The method according to claim 13, comprising:
before projecting the patterned beam, moving the substrate table to a position such that a receptacle on the substrate table is positioned under the liquid confinement structure, and
while the substrate table is held stationary relative to the liquid confinement structure, moving a closing plate from the liquid confinement structure toward the receptacle.

15. The method according to claim 13, further comprising providing an adjustment plate to vary a depth of a receptacle on the substrate table configured to hold the closing plate.

16. The method according to claim 13, comprising moving the closing plate using a linear actuator provided in the substrate table.

17. The method according to claim 13, comprising moving the closing plate using a pin mechanism provided in the substrate table.

18. A substrate table for a lithographic apparatus, the substrate table comprising:
   a support surface configured to hold a substrate;
   a receptacle configured to contain a closing plate; and
   a displacement mechanism provided in the substrate table arranged to move the closing plate from the receptacle.

19. The substrate table according to claim 18, comprising the closing plate.

20. The substrate table according to claim 18, comprising an adjustment plate configured to raise the closing plate.

21. The substrate table according to claim 18, wherein the displacement mechanism is selected from the group consisting of a linear actuator, a pin mechanism, and a plurality of leaf springs.

22. The substrate table according to claim 18, wherein the displacement mechanism is arranged to move the closing plate toward the receptacle.

23. A lithographic apparatus, comprising:
   a substrate table constructed to hold a substrate;
   a projection system configured to project a patterned radiation beam onto a target portion of the substrate;
   a liquid supply system configured to at least partly fill a space between the projection system and the substrate with a liquid, the liquid supply system comprising a liquid confinement structure configured to at least party confine the liquid within the space;
   a closing plate configured to close off the liquid confinement structure so as to retain a fluid in the liquid confinement structure when the substrate or the substrate table is no longer adjacent the liquid confinement structure; and
   a displacement mechanism provided in the substrate table arranged to move the closing plate toward the liquid confinement structure.

24. The apparatus according to claim 23, comprising a receptacle in the substrate table configured to hold the closing plate.

25. The apparatus according to claim 24, wherein the receptacle comprises an adjustment plate configured to raise the closing plate.

26. The apparatus according to claim 23, wherein the displacement mechanism comprises a linear actuator.

27. The apparatus according to claim 26, wherein the displacement mechanism comprises a pin mechanism.

28. The apparatus according to claim 27, wherein the pin mechanism comprises 3 pins.

29. The apparatus according to claim 23, further comprising a movable closing plate holder disposed between the displacement mechanism and, in use, a closing plate.

30. The apparatus according to claim 23, wherein the displacement mechanism comprises a leaf spring actuated by a magnet.

31. The apparatus according to claim 30, comprising two leaf springs actuated by an electromagnet.

32. The apparatus according to claim 23, wherein the displacement mechanism is arranged to move the closing plate from the liquid confinement structure.

* * * * *